United States Patent [19]

Fukuda et al.

[11] 4,342,881
[45] Aug. 3, 1982

[54] LAMINATED BUS BAR AND METHOD OF MANUFACTURE

[75] Inventors: Sunichi Fukuda, Kukizaki; Masaaki Muto, Ryugasaki, both of Japan

[73] Assignee: Rogers Corporation, Rogers, Conn.

[21] Appl. No.: 154,375

[22] Filed: May 29, 1980

[30] Foreign Application Priority Data

May 31, 1979 [JP] Japan ................................ 54-067862

[51] Int. Cl.³ .............................................. H01B 5/00
[52] U.S. Cl. .................................. 174/72 B; 361/306; 29/854
[58] Field of Search ..................... 174/72 B; 361/306; 29/854, 855

[56] References Cited

U.S. PATENT DOCUMENTS 4,236,046 11/1980 De Vries ........................... 174/72 B Primary Examiner—Roy N. Envall, Jr.
Attorney, Agent, or Firm—Fishman and Van Kirk

[57] ABSTRACT

A laminated bus bar with rigid discrete dielectric elements sandwiched between flat conductors is assembled with comparative ease by coating the opposed faces of the elements with a low melt point conductive material except in bands adjacent to the edges of the elements. When the conductive material is reflowed to bond the elements to the conductors, there will be no development of short circuits across the edges of the elements.

9 Claims, 2 Drawing Figures

LAMINATED BUS BAR AND METHOD OF MANUFACTURE

BACKGROUND OF THE INVENTION (1) Field of the Invention

The present invention relates to bus bars and particularly to miniaturized bus bars having a low characteristic impedance with low inductance and high distributed capacitance. More specifically, this invention is directed to methods for the production of miniaturized bus bars including plural dielectric members, and particularly thin ceramic plates, disposed between a pair of bus conductors. Accordingly, the general objects of the present invention are to provide novel and improved articles and methods of such character.

(2) Description of the Prior Art

Multi-conductor bus bars of the type which include either flat-plate capacitors or discrete dielectric elements positioned between parallel conductors are known in the art. Such bus bars are characterized by a low characteristic impedance, low inductance and high distributed capacitance. These characteristics are highly desirable, and in some cases essential, where the components of the circuit in which the bus bar is utilized must be protected from high frequency noise. The aforementioned characteristics of bus bars of the type which employ discrete dielectric elements are superior to those of prior laminated bus bars wherein the conductors are separated by a dielectric film or system of films. However, because the the possibility of the occurrence of short circuits between conductors in the spaces between adjacent of the discrete dielectric elements, it has previously been difficult to successfully produce bus bars of the type being discussed.

SUMMARY OF THE INVENTION

The present invention overcomes the above briefly discussed and other deficiencies and disadvantage of the prior art by providing novel and improved laminated bus bars of the type which include plural discrete dielectric elements. The present invention also encompasses a unique and economical method for the manufacture of such novel laminated bus bars.

A bus bar in accordance with the present invention is characterized by at least a pair of parallel flat conductors. Plural wafers of dielectric material, ceramic plates for example, are positioned between the conductors and bonded thereto. The bus conductors thus define the plates of a plurality of capacitors which are physically and electrically connected in parallel. Subsequent to sandwiching the dielectric elements between the bus conductors, the entire bus bar may be encapsulated in a suitable insulating material.

In accordance with a preferred embodiment of the invention, the dielectric elements are ceramic plates, typically rectangular in shape, having portions of the opposed faces thereof coated with a conductive material which melts at a reltively low temperature. Specifically, regions extending inwardly from each side edge on each face of the dielectric elements are free of the conductive coating. Accordingly, when the dielectric elements are positioned between a pair of conductors and the assembly heated, whereby the low melting point conductive material will reflow and bond to the conductors, the conductor material will not extend around the edges of the dielectric elements resulting in a short circuit between bus conductors.

Also in accordance with a preferred embodiment of the present invention, subsequent to the bonding of the bus conductors to the ceramic plates or other dielectric elements, the bus bar assembly is hermetically encapsulated. Encapsulation is accomplished by uniformally coating the bus bar with a non-conductive resin in powder form, except in the area of terminals, and thereafter heating the bus bar to melt and cure the resin.

BRIEF DESCRIPTION OF THE DRAWING

The present invention may be better understood and its numerous objects and advantages will become apparent to those skilled in the art by reference to the accompanying drawing wherein like reference symbols refer to like elements in the several FIGURES and in which.

DESCRIPTION OF THE PREFERRED EMBODIMENT

Figure 1:
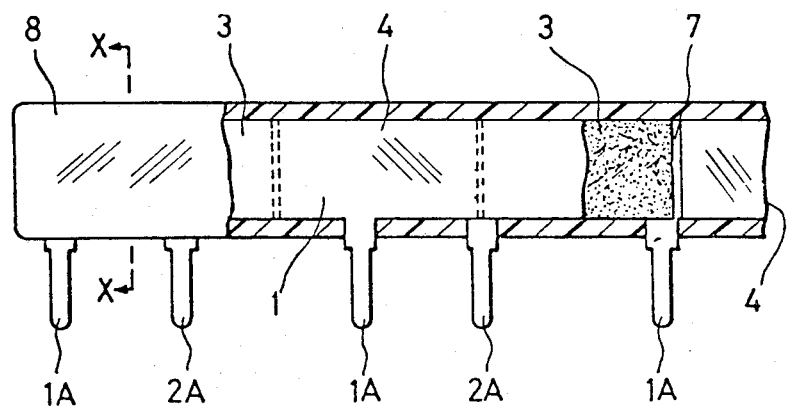
FIG. 1 is a top plane view, with elements partly broken away, of a portion of a laminated bus bar in accordance with the preferred embodiment of the present invention.
Figure 2:
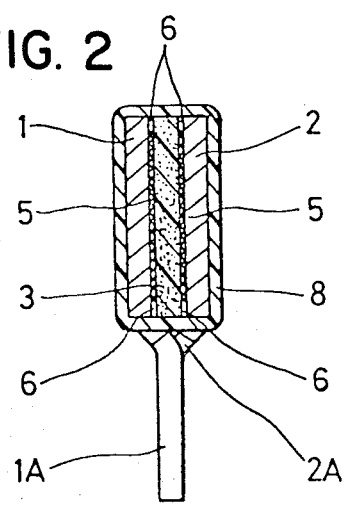
FIG. 2 is an enlarged view, taken along line X—X of FIG. 1, of the bus bar of FIG. 1.

With reference jointly to FIGS. 1 and 2, a bus bar in accordance with the preferred embodiment of the present invention employs a pair of oppositely disposed elongated parallel conductors 1 and 2. Conductors 1 and 2 are typically formed from a copper foil or other thin copper sheet, for example by stamping, and will respectively have, extending outwardly from aligned first edges thereof, terminals or tabs 1A and 2A. Conductors 1 and 2 are separated by wafers or plates 3 and 4 which are comprised of the appropriate dielectric material or materials. In the disclosed embodiment, the wafers 3 and 4 are of rectangular shape, are all of the same thickness and all have the same width as cnductors 1 and 2. The wafers 3 will typically be thin plates of a suitable ceramic material while the wafers 4 will either be comprised of the same ceramic material or will consist of spacers of a second dielectric material which is less fragile than the ceramic material comprising plates 3. It will be understood that all of wafers 3 and 4 may be comprised of the same ceramic material. Spaces are left between adjacent wafers 3 and 4 to accommodate dimensional changes which may occur during the bonding process to be described hereinafter.

The ceramic plates 3 are provided, on the opposite faces thereof, with a coating 5 of a conductive material having a low melting temperature; i.e., a solder or solder paste. This reflowable; i.e., low melting temperature; conductive material is applied to the ceramic plates in such a manner as to leave strips 6 along the opposite edges of the ceramic plates, on each side of plates 3, free from the conductor material 5. Accordingly, when the wafers 3 and 4 are positioned between a pair of conductors and the assembly is heated, as the conductive material 5 reflows it will not extend about the edges of the wafers 3 and possibly produce a short circuit between the spaced conductors. Upon cooling, the conductive material 5 will bond to the conductors 1 and 2 thus producing an integral bus bar assembly.

After the bonding of the conductors to the dielectric elements, as discussed above, the bus bar assembly, with the exception of the terminals 1A and 2A, is encapsulated by forming a coating 8 of insulating material on the assembly. This is preferably accomplished by uniformly coating the assembly with a powdered resin, such as a polyester, acrylic or epoxy resin, and then heating the assembly to melt and cure the resin.

As many be seen from FIG. 2, it is customary to bend the terminals 1A and 2A such that all of the terminals extend outwardly from the bus bar in the same plane. This is typically accomplished by bending the terminals at their roots such that all the terminals lie in the plane of the wafers 3 and 4. The bending of the terminals may be performed at any stage during the assembly process prior to application of the coating 8.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. A bus bar comprising:
   a pair of elongated parallel flat bus bar conductors;
   a plurality of thin, flat, rigid dielectric elements, said dielectric elements being positioned between and spacially displaced from said bus bar conductors, said dielectric elements each having a pair of oppositely disposed planar surfaces, said surfaces of said dielectric elements being parallel to said bus bar conductors, said electrical elements being spacially displaced from one another in a linear array; and
   means bonding said planar surfaces of said dielectric elements to said bus bar conductors, said bonding means being comprised of conductive metal which melts and flows at a temperature below the melting point of the bus bar conductors and the dielectric element.

2. The bus bar of claim 1 further comprising:
   a layer of plastic material encapsulating the laminate defined by said conductors and dielectric elements; and
   a plurality of terminals extending through said plastic layer from each of said conductors.

3. The bus bar of claim 2 wherein said terminals lie in a common plane which is parallel to planes defined by the surfaces of said conductors.

4. The bus bar of claim 1 wherein at least some of said dielectric elements are comprised of a ceramic material.

5. The bus bar of claim 4 wherein said ceramic elements are plates of rectangular shape, said plates having the same width as said conductors.

6. The bus bar of claim 5 further comprising:
   a layer of plastic material encapsulating the laminate defined by said conductors and dielectric elements; and
   a plurality of terminals extending through said plastic layer from each of said conductors.

7. The bus bar of claim 6 wherein said terminals lie in a common plane which is parallel to planes defined by the surfaces of said conductors.

8. The method of manufacturing a bus bar comprising the steps of:
   melting a metallic conductive material;
   coating a portion of the opposed faces of a plurality of thin, flat, rigid dielectric elements with the molten material, the coated portions extending outwardly from the centers of the dielectric elements and terminating so as to leave a region extending inwardly from each edge of each face of the dielectric elements free from the coating;
   allowing the coating to resolidify;
   arranging the coated dielectric elements in a linear array on a first elongated bus bar conductor, spaces being left between adjacent dielectric elements in the array;
   positioning a second bus bar conductor over and in contact with the coated dielectric elements, the second bus bar conductor being parallel with the first bus bar conductor;
   applying heat to the assembly of bus bar conductors and dielectric elements to remelt the coating material; and
   cooling the assembly whereby the remelted coating material will resolidify and bond to the bus bar conductors and dielectric elements.

9. The method of claim 8 further comprising the step of:
   encapsulating the assembly of bus bar conductors and dielectric elements within a plastic material.

* * * * *